(12) United States Patent
Ishii

(10) Patent No.: US 11,305,357 B2
(45) Date of Patent: Apr. 19, 2022

(54) COATED CUTTING TOOL

(71) Applicant: TUNGALOY CORPORATION, Fukushima (JP)

(72) Inventor: Katsuya Ishii, Iwaki (JP)

(73) Assignee: TUNGALOY CORPORATION, Fukushima (JP)

( * ) Notice: Subject to any disclaimer, the term of this patent is extended or adjusted under 35 U.S.C. 154(b) by 0 days.

(21) Appl. No.: 17/076,038

(22) Filed: Oct. 21, 2020

(65) Prior Publication Data
US 2021/0187621 A1  Jun. 24, 2021

(30) Foreign Application Priority Data

Dec. 19, 2019  (JP) .............................. JP2019-228993

(51) Int. Cl.
| | |
|---|---|
| *C23C 16/36* | (2006.01) |
| *B23B 27/14* | (2006.01) |
| *C23C 28/04* | (2006.01) |
| *C23C 16/30* | (2006.01) |

(Continued)

(52) U.S. Cl.
CPC ............ *B23B 27/14* (2013.01); *C23C 16/303* (2013.01); *C23C 16/32* (2013.01); *C23C 16/36* (2013.01); *C23C 16/403* (2013.01); *C23C 28/044* (2013.01); *B23B 2228/04* (2013.01); *B23B 2228/105* (2013.01); *B23B 2228/36* (2013.01)

(58) Field of Classification Search
CPC ........ B23B 2228/04–105; B23B 27/14; B23B 27/148; C23C 28/04–048; C23C 28/30–36; C23C 28/40–44; C23C 30/00; C23C 30/005; C23C 16/303; C23C 16/308; C23C 16/32; C23C 16/34; C23C 16/347; C23C 16/36; C23C 14/0635; C23C 14/0641; C23C 14/0658; C23C 14/0664; C23C 14/0688
See application file for complete search history.

(56) References Cited

U.S. PATENT DOCUMENTS

| | | | | |
|---|---|---|---|---|
| 6,756,111 B1 * | 6/2004 | Okada | ................... | C23C 30/005 428/142 |
| 10,857,598 B2 * | 12/2020 | Satoh | ...................... | C23C 16/32 |

(Continued)

FOREIGN PATENT DOCUMENTS

| | | | | |
|---|---|---|---|---|
| EP | 2703102 A1 | 3/2014 | | |
| EP | 3366796 A1 * | 8/2018 | ............. | C23C 16/36 |

(Continued)

*Primary Examiner* — Z. Jim Yang
*Assistant Examiner* — Zheren Jim Yang
(74) *Attorney, Agent, or Firm* — Studebaker & Brackett PC

(57) ABSTRACT

A coated cutting tool of the present invention comprises a substrate and a coating layer formed on a surface of the substrate, wherein the coating layer comprises a lower layer and an upper layer formed on a surface of the lower layer, the lower layer comprises a specified Ti compound layer having a specified average thickness, the upper layer comprises an α-aluminum oxide layer having a specified average thickness, the Ti compound layer comprises at least one Ti carbonitride layer, the Ti carbonitride is composed of $Ti(C_xN_{1-x})$ ($0.65 < x \leq 0.90$), and a texture coefficient TC(331) of a (331) plane in the Ti carbonitride layer satisfies a specified range.

11 Claims, 1 Drawing Sheet

(51) Int. Cl.
*C23C 16/32* (2006.01)
*C23C 16/40* (2006.01)

(56) References Cited

U.S. PATENT DOCUMENTS

| | | | |
|---|---|---|---|
| 2004/0106016 A1* | 6/2004 | Okada | C23C 16/36 |
| | | | 407/119 |
| 2004/0110040 A1* | 6/2004 | Ruppi | C23C 30/005 |
| | | | 428/698 |
| 2004/0265541 A1 | 12/2004 | Ruppi | |
| 2005/0013995 A1* | 1/2005 | Ruppi | C23C 16/36 |
| | | | 428/408 |
| 2007/0218313 A1* | 9/2007 | Okada | B23B 51/06 |
| | | | 428/698 |
| 2011/0002749 A1* | 1/2011 | Ljungberg | C23C 28/00 |
| | | | 407/119 |
| 2012/0225247 A1* | 9/2012 | Sone | C23C 28/044 |
| | | | 428/141 |
| 2012/0270037 A1* | 10/2012 | Paseuth | C23C 28/044 |
| | | | 427/248.1 |
| 2012/0275870 A1 | 11/2012 | Paseuth et al. | |
| 2014/0291036 A1* | 10/2014 | Leicht | C23C 28/42 |
| | | | 427/255.7 |
| 2018/0258525 A1* | 9/2018 | Cho | C23C 28/044 |
| 2019/0076934 A1* | 3/2019 | Satoh | C01B 21/0828 |
| 2021/0123140 A1* | 4/2021 | Engqvist | C23C 28/044 |

FOREIGN PATENT DOCUMENTS

| | | | | |
|---|---|---|---|---|
| JP | H06-158325 A | | 6/1994 | |
| JP | H07-285001 A | | 10/1995 | |
| JP | 2009285760 A | * | 12/2009 | ............ C23C 16/36 |
| JP | 2011-011331 A | | 1/2011 | |
| JP | 5768308 B2 | | 8/2015 | |
| JP | 5884138 B2 | | 3/2016 | |
| WO | 00/79022 A1 | | 12/2000 | |
| WO | 2012/144088 A1 | | 10/2012 | |
| WO | WO-2013081047 A1 | * | 6/2013 | ............ C23C 16/36 |
| WO | WO-2020002500 A1 | * | 1/2020 | ........... C23C 16/405 |

* cited by examiner

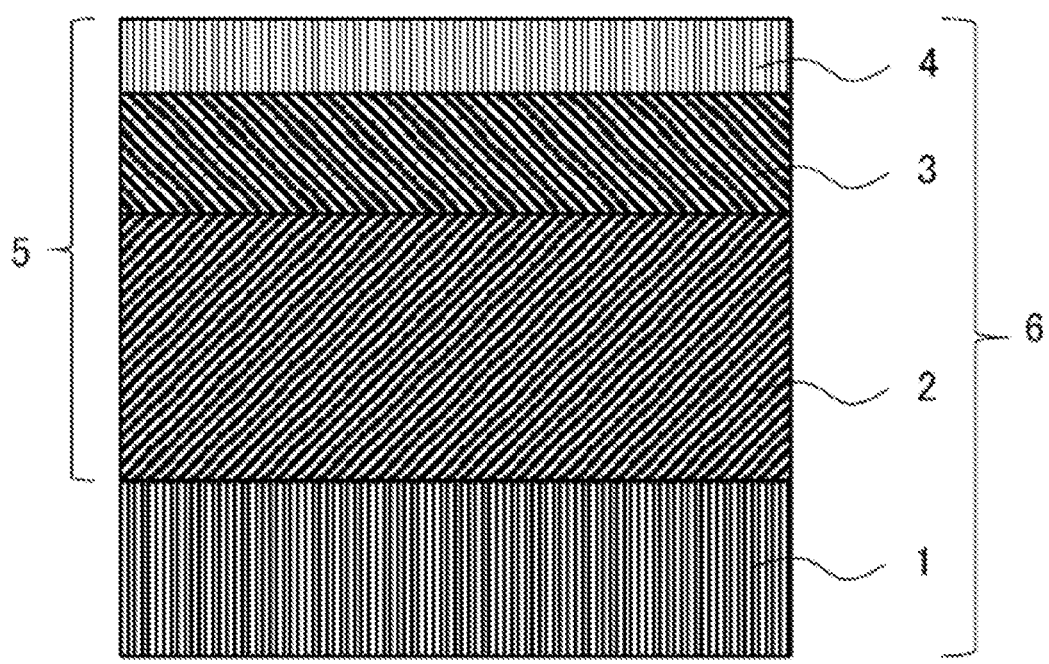

COATED CUTTING TOOL

TECHNICAL FIELD

The present invention relates to a coated cutting tool.

BACKGROUND ART

It is well known to use a coated cutting tool in which a coating layer having a total thickness of 3 µm to 20 µm is formed by a chemical vapor deposition method on the surface of a substrate composed of a cemented carbide, for cutting steel, cast iron, and the like. Known examples of the above-mentioned coating layer include a coating layer consisting of a single layer of one kind selected from the group consisting of a Ti carbide, nitride, carbonitride, oxycarbide and oxycarbonitride, and aluminum oxide, or consisting of multiple layers of two or more kinds selected from the foregoing.

Patent Publication JP-A-06-158325 describes a surface-coated cermet cutting tool with improved wear resistance of a hard coating layer, in which a hard coating layer comprising multiple layers of two or more kinds selected from a Ti carbide, nitride, carbonitride and oxycarbonitride, and aluminum oxide is formed by chemical vapor deposition on the surface of a cermet substrate made of a tungsten carbide based cemented carbide or a titanium carbonitride based cermet, wherein at least one of the constituent layers of the hard coating layer excluding the first layer in contact with the substrate surface is composed of titanium carbonitride, and at least one of the titanium carbonitride layers is composed of titanium carbonitride showing the highest peak intensity on a (422) plane in X-ray diffraction.

Japanese Patent No. 5768308 describes a surface-coated cutting tool comprising a substrate and a coating film formed on the substrate, wherein the coating film comprises at least one TiCN layer, the TiCN layer includes a columnar crystal region, the columnar crystal region has a composition of $TiC_xN_y$, where $0.65 \leq x/(x+y) \leq 0.90$, a plane spacing of (422) planes is 0.8765 Å to 0.8780 Å, and TC(422) is the largest among the orientation indexes TC(hkl).

Japanese Patent No. 5884138 describes a surface-coated cutting tool comprising a substrate and a coating film formed on the substrate, wherein the coating film comprises at least one TiCN layer, the TiCN layer includes a columnar crystal region, the columnar crystal region has a composition of $TiC_xN_y$, where $0.65 \leq x/(x+y) \leq 0.90$, a plane spacing of (422) planes is 0.8765 Å to 0.8790 Å, and TC(220) is the largest among the orientation indexes TC(hkl).

SUMMARY

Technical Problem

The speed, feed and cutting depth of cutting processes have significantly increased in recent times, which, in combination with increased strength of work materials, has created a demand for further improvement in wear resistance and fracture resistance of tools compared to those involved in the prior art. In particular, in recent years, strength of cast iron has been increased to enable thickness reduction, and the number of cutting processes in which a load is exerted on a coating cutting tool, such as high-speed cutting of cast iron, has increased. When the conventional coated cutting tools such as described in Patent Publication JP-A-06-158325, Japanese Patent No. 5768308 and Japanese Patent No. 5884138 are used under such severe cutting conditions, the tool life cannot be extended due to rapid wear, or chipping and fracture may occur due to insufficient toughness.

Under such a background, the surface-coated cermet cutting tool described in Patent Publication JP-A-06-158325 may have low hardness and insufficient wear resistance due to a low carbon content in the coating layer. Further, the surface-coated cutting tool described in Japanese Patent No. 5768308 may have insufficient adhesion or insufficient wear resistance because the temperature at which the Ti carbonitride layer in the coating layer is formed is low. In the surface-coated cutting tool described in Japanese Patent No. 5884138, a certain effect can be considered to be achieved in terms of the wear resistance of the Ti carbonitride layer in the coating layer, but the tool may have insufficient toughness, which can sometimes result in insufficient chipping resistance and fracture resistance.

The present invention has been made in light of the above circumstances, and an object of the present invention is to provide a coated cutting tool which has excellent wear resistance and fracture resistance and which accordingly allows for an extended tool life.

Solution to Problem

The present inventors have conducted extensive research on extending the tool life of a coated cutting tool from the above perspective, and have found that with the below-described configuration in which the coating layer comprises at least one Ti carbonitride layer and a texture coefficient of a (331) plane in the Ti carbonitride layer falls within a specified range, excellent balance between the wear resistance and the fracture resistance is achieved, and as a result, the tool life can be extended, even when the atomic ratio of carbon in the Ti carbonitride layer is above 0.65 and not more than 0.90.

That is, the present invention is as follows.

[1]

A coated cutting tool comprising a substrate and a coating layer formed on a surface of the substrate, wherein the coating layer comprises a lower layer and an upper layer formed on a surface of the lower layer, the lower layer comprises a Ti compound layer comprising one or more layers selected from the group consisting of a Ti carbide layer, a Ti nitride layer, a Ti carbonitride layer, a Ti carboxide layer, and a Ti oxycarbonitride layer, an average thickness of the lower layer is 3.0 µm or more and 15.0 µm or less, the upper layer comprises an α-aluminum oxide layer, an average thickness of the upper layer is 3.0 µm or more and 15.0 µm or less, the Ti compound layer comprises at least one Ti carbonitride layer, the Ti carbonitride layer has a composition represented by a following formula (i):

$$Ti(C_xN_{1-x}) \quad (i),$$

wherein in the formula, x represents an atomic ratio of a C element to a total of the C element and an N element in the Ti carbonitride layer, and satisfies $0.65 < x \leq 0.90$), and In the Ti carbonitride layer, a texture coefficient TC (331) of a (331) plane represented by a following formula (1) is 1.5 or more and 4.0 or less:

$$TC(331) = \frac{I(331)}{I_0(331)} \left\{ \frac{1}{8} \sum \frac{I(hkl)}{I_0(hkl)} \right\}^{-1} \quad (1)$$

wherein in the formula (1), I(hkl) represents a peak intensity of an (hkl) plane in X-ray diffraction of the Ti carbonitride layer, $I_0$(hkl) represents an average value of a standard diffraction intensity of the (hkl) plane of Ti carbide in a JCPDS card number 32-1383 and a standard diffraction intensity of the (hkl) plane of Ti nitride in a JCPDS card number 32-1420, and (hkl) indicates eight crystal planes (111), (200), (220), (311), (331), (420), (422), and (511).

[2]
The coated cutting tool according to [1], wherein the texture coefficient TC(331) in the Ti carbonitride layer is 2.0 or more and 4.0 or less.

[3]
The coated cutting tool according to [1] or [2], wherein grains constituting the Ti carbonitride layer have an average grain size of 0.3 μm or more and 2.0 μm or less.

[4]
The coated cutting tool according to any one of [1] to [3], wherein the coating layer comprises an outer layer formed on a surface of the upper layer,
the outer layer comprises a Ti nitride layer and/or a Ti carbonitride layer,
an average thickness of the outer layer is 0.1 μm or more and 5.0 μm or less.

[5]
The coated cutting tool according to any one of [1] to [4], wherein an average thickness of the entire coating layer is 7.5 μm or more and 25.0 μm or less.

[6]
The coated cutting tool according to any one of [1] to [5], wherein the substrate is composed of any of a cemented carbide, a cermet, a ceramic and a cubic boron nitride sintered body.

Advantageous Effects of Invention

According to the present invention, it is possible to provide a coated cutting tool that has excellent wear resistance and fracture resistance, thereby making it possible to extend the tool life.

BRIEF DESCRIPTION OF DRAWINGS

The FIGURE is a schematic cross-sectional view showing an example of a coated cutting tool according to the present invention.

DESCRIPTION OF EMBODIMENTS

Hereinafter, a mode for carrying out the present invention (hereinafter, simply referred to as "the present embodiment") will be described in detail with reference to the drawings as necessary, but the present invention is not limited to the present embodiment described below. The present invention can be variously modified without departing from the gist thereof. In addition, in the drawings, positional relationships such as up, down, left, and right are based on the positional relationships shown in the drawings unless otherwise specified. Further, the dimensional ratios in the drawings are not limited to the illustrated ratios.

A coated cutting tool of the present embodiment comprises a substrate and a coating layer formed on a surface of the substrate, wherein the coating layer comprises a lower layer and an upper layer formed on a surface of the lower layer, the lower layer comprises a Ti compound layer comprising one or more layers selected from the group consisting of a Ti carbide layer, a Ti nitride layer, a Ti carbonitride layer, a Ti oxycarbide layer, and a Ti oxycarbonitride layer, an average thickness of the lower layer is 3.0 μm or more and 15.0 μm or less, the upper layer comprises an α-aluminum oxide layer, an average thickness of the upper layer is 3.0 μm or more and 15.0 μm or less, the Ti compound layer comprises at least one Ti carbonitride layer, the Ti carbonitride layer has a composition represented by a following formula (i), and in the Ti carbonitride layer, a texture coefficient TC(331) of a (331) plane represented by a following formula (1) is 1.5 or more and 4.0 or less:

$$Ti(C_xN_{1-x}) \quad (i),$$

wherein in the formula, x represents an atomic ratio of the C element to the total of the C element and the N element in the Ti carbonitride layer, and satisfies $0.65 < x \leq 0.90$, and

$$TC(331) = \frac{I(331)}{I_0(331)} \left\{ \frac{1}{8} \sum \frac{I(hkl)}{I_0(hkl)} \right\}^{-1}, \quad (1)$$

wherein in the formula (1), I(hkl) represents a peak intensity of an (hkl) plane in X-ray diffraction of the Ti carbonitride layer, $I_0$(hkl) represents an average value of a standard diffraction intensity of the (hkl) plane of Ti carbide in a JCPDS card number 32-1383 and a standard diffraction intensity of the (hkl) plane of Ti nitride in a JCPDS card number 32-1420, and (hkl) indicates eight crystal planes (111), (200), (220), (311), (331), (420), (422), and (511). Here, the average value of $I_0$(111) is 76, the average value of $I_0$(200) is 100, the average value of $I_0$(220) is 52.5, the average value of $I_0$(311) is 24.5, the average value of $I_0$(331) is 9.5, the average value of $I_0$(420) is 19.5, the average value of $I_0$(422) is 18.5, and the average value of $I_0$(511) is 11.5.

Since the coated cutting tool of the present embodiment has the above-described configuration, excellent balance between wear resistance and fracture resistance is achieved even under cutting conditions for machining a high-strength work material and under cutting conditions under which a load acts on the cutting tool. Therefore, the tool life can be extended. The factors that improve the wear resistance and fracture resistance of the coated cutting tool of the present embodiment are considered hereinbelow. However, the considered factors are not limiting. First, in the coated cutting tool of the present embodiment, the Ti carbonitride layer comprised in the lower layer has a composition represented by $Ti(C_xN_{1-x})$, and where x in the composition $Ti(C_xN_{1-x})$ exceeds 0.65, the hardness is improved to improve the wear resistance, and when x is 0.90 or less, the decrease in toughness caused by the increase in hardness is suppressed and the fracture resistance is improved. Further, in the coated cutting tool of the present embodiment, where the texture coefficient TC(331) of the (331) plane represented by the formula (1) in the Ti carbonitride layer comprised in the lower layer is 1.5 or more, the grain size of the grains constituting the Ti carbonitride layer can be increased even when x in the composition $Ti(C_xN_{1-x})$ is set to a specific large range, and as a result, the toughness is improved. As a consequence, the coated cutting tool of the present embodiment has improved wear resistance and fracture resistance. Meanwhile, in the coated cutting tool of the present embodiment, where the texture coefficient TC(331) of the (331) plane represented by the formula (1) in the Ti carbonitride layer comprised in the lower layer is 4.0 or less, the cutting tool can be easily manufactured. Further, in the coated cutting tool of the present embodiment, since the upper layer comprises an α-aluminum oxide layer, it is possible to suppress reaction wear due to oxidation of the Ti compound layer of the lower layer, and as a result, wear resistance is improved. Due to a combination of these effects, the coated cutting tool of the present embodiment has excellent balance of wear resistance and fracture resistance and the tool life can be extended.

The FIGURE is a schematic sectional view showing an example of the coated cutting tool of the present embodiment. A coated cutting tool 6 comprises a substrate 1 and a coating layer 5 formed on the surface of the substrate 1. In the coating layer 5, a lower layer 2, an upper layer 3, and an outer layer 4 are layered in this order from the substrate 1 side.

The coated cutting tool of the present embodiment comprises a substrate and a coating layer formed on the surface of the substrate. Specific examples of the type of coated cutting tool include a cutting edge exchangeable cutting insert for milling or turning, a drill and an end mill.

The substrate in the present embodiment is not particularly limited as long as it can be used as the substrate of the coated cutting tool. Examples of such a substrate include cemented carbides, cermets, ceramics, cubic boron nitride sintered bodies, diamond sintered bodies, and high-speed steels. Among them, the substrate is preferably composed of a cemented carbide, a cermet, a ceramic and a cubic boron nitride sintered body, because even better wear resistance and fracture resistance can be achieved. From the same viewpoint, the substrate is more preferably composed of a cemented carbide.

The surface of the substrate may be modified. For example, when the substrate is made of a cemented carbide, a β free layer may be formed on the surface thereof. Further, where the substrate is made of a cermet, a hardened layer may be formed on the surface thereof. The effects of the present invention can be obtained even if the surface of the substrate is modified as described above.

The average thickness of the entire coating layer in the present embodiment is preferably 7.5 μm or more and 25.0 μm or less. Where the average thickness is 7.5 μm or more, wear resistance is improved, and where the average thickness is 25.0 μm or less, adhesion of the coating layer to the substrate and fracture resistance are improved. From the same viewpoint, the average thickness of the coating layer is more preferably 8.0 μm or more and 24.0 μm or less, and even more preferably 10.0 μm or more and 23.0 μm or less. The average thickness of each layer and the entire coating layer in the coated cutting tool of the present embodiment can be determined by measuring the thickness of each layer or the thickness of the entire coating layer from the cross-section at three or more places in each layer or the entire coating layer and calculating the arithmetic mean value.

Lower Layer

The lower layer of the present embodiment comprises a Ti compound layer comprising one or more layers selected from the group consisting of a Ti carbide layer (hereinafter also referred to as "TiC layer"), a Ti nitride layer (hereinafter also referred to as "TiN layer"), a Ti carbonitride layer (hereinafter also referred to as a "TiCN layer"), a Ti oxycarbide layer (hereinafter also referred to as a "TiCO layer"), and a Ti oxycarbonitride layer (hereinafter also referred to as a "TiCNO layer"). Where the coated cutting tool comprises the lower layer between the substrate and the upper layer including α-aluminum oxide (hereinafter also referred to as "α-Al$_2$O$_3$"), wear resistance and adhesion are improved.

The lower layer may be constituted of one layer or may be constituted of multiple layers (for example, two layers or three layers), but is preferably constituted of multiple layers, more preferably of two or three layers, and even more preferably of three layers. When the lower layer is constituted of three layers, the lower layer may comprise a TiC layer or a TiN layer as a first layer on the surface of the substrate, a TiCN layer as a second layer on the surface of the first layer, and a TiCNO layer or a TiCO layer as a third layer on the surface of the second layer. Among these configurations, the lower layer may comprise a TiN layer as the first layer on the surface of the substrate, a TiCN layer as the second layer on the surface of the first layer, and a TiCNO layer as the third layer on the surface of the second layer.

The average thickness of the lower layer in this embodiment is 3.0 μm or more and 15.0 μm or less. When the average thickness is 3.0 μm or more, the wear resistance is improved. Meanwhile, when the average thickness of the lower layer is 15.0 μm or less, the fracture resistance is improved mainly due to the suppression of peeling of the coating layer. From the same viewpoint, the average thickness of the lower layer is more preferably 4.0 μm or more and 14.5 μm or less, and further preferably 5.0 μm or more and 14.0 μm or less.

The average thickness of the first layer (TiC layer or TiN layer) is preferably 0.05 μm or more and 1.0 μm or less from the viewpoint of further improving wear resistance and fracture resistance. From the same viewpoint, the average thickness of the first layer (TiC layer or TiN layer) is more preferably 0.10 μm or more and 0.50 μm or less, and further preferably 0.15 μm or more and 0.30 μm or less.

The average thickness of the second layer (TiCN layer) is preferably 2.0 μm or more and 14.5 μm or less from the viewpoint of further improving wear resistance and fracture resistance. From the same viewpoint, the average thickness of the second layer (TiCN layer) is more preferably 3.0 μm or more and 14.0 μm or less, and further preferably 4.5 μm or more and 13.5 μm or less.

The average thickness of the third layer (TiCNO layer or TiCO layer) is preferably 0.1 μm or more and 1.0 μm or less from the viewpoint of further improving wear resistance and fracture resistance. From the same viewpoint, the average thickness of the third layer (TiCNO layer or TiCO layer) is more preferably 0.2 μm or more and 0.5 μm or less.

The Ti compound layer of the lower layer comprises at least one Ti carbonitride layer, and the Ti carbonitride layer has a composition represented by the following formula (i):

$$\text{Ti}(C_xN_{1-x}) \tag{i}$$

wherein in the formula, x represents an atomic ratio of the C element to the total of the C element and the N element in the Ti carbonitride layer, and satisfies $0.65 < x \leq 0.90$.

Where x exceeds 0.65 in the composition Ti($C_xN_{1-x}$), the hardness improves, so that the wear resistance of the coated cutting tool improves, and where x is 0.90 or less, the decrease in toughness due to the increase in the hardness is suppressed, and the fracture resistance of the coated cutting tool is improved. From the same viewpoint, x is preferably 0.66 or more and 0.89 or less, and more preferably 0.67 or more and 0.89 or less.

In the Ti carbonitride layer of the lower layer, a texture coefficient TC(331) of a (331) plane represented by a following formula (1) is 1.5 or more and 4.0 or less:

$$TC(331) = \frac{I(331)}{I_0(331)} \left\{ \frac{1}{8} \sum \frac{I(hkl)}{I_0(hkl)} \right\}^{-1}, \tag{1}$$

wherein in the formula (1), I(hkl) represents a peak intensity of an (hkl) plane in X-ray diffraction of the Ti carbonitride layer, $I_0$(hkl) represents an average value of a standard diffraction intensity of the (hkl) plane of Ti carbide in a JCPDS card number 32-1383 and a standard diffraction intensity of the (hkl) plane of Ti nitride in a JCPDS card number 32-1420, and (hkl) indicates eight crystal planes (111), (200), (220), (311), (331), (420), (422), and (511).

In the coated cutting tool of the present embodiment, where the texture coefficient TC(331) of the (331) plane represented by the above formula (1) is 1.5 or more in the Ti carbonitride layer comprised in the lower layer, the grain size of the grains constituting the Ti carbonitride layer can be increased even when x in the composition $Ti(C_xN_{1-x})$ is set to a specific large range, and as a result, the toughness is improved. As a consequence, the coated cutting tool of the present embodiment has improved wear resistance and fracture resistance. Meanwhile, in the coated cutting tool of the present embodiment, where the texture coefficient TC(331) of the (331) plane represented by the formula (1) in the Ti carbonitride layer comprised in the lower layer is 4.0 or less, the cutting tool can be easily manufactured. From the same viewpoint, in the Ti carbonitride layer comprised in the lower layer, the texture coefficient TC(331) of the (331) plane represented by the above formula (1) is preferably 2.0 or more and 4.0 or less, and more preferably 2.2 or more and 3.8 or less.

Conventionally, in order to produce a Ti carbonitride layer having an atomic ratio of carbon exceeding 0.7, it is necessary to increase the partial pressure of $C_2H_4$ or the like serving as a carbon source. Therefore, the grains that make up the layer tend to be refined, and as a result, the coated cutting tool may have insufficient toughness. Since the coated cutting tool of the present embodiment has the Ti carbonitride layer oriented in the (331) plane as described above, it is possible to prevent the grains constituting the Ti carbonitride layer from being refined, and as a result, the coated cutting tool has improved toughness and excellent fracture resistance. Further, in the related art, a Ti carbonitride layer oriented to the (331) plane has not been obtained, and a Ti carbonitride layer oriented to the (331) plane has a fracture resistance superior to that in the case of orientation to the (220) plane, and wear resistance superior to that in the case of orientation in the (422) plane.

In the present embodiment, the texture coefficient TC(331) of the Ti carbonitride layer comprised in the lower layer can be calculated as follows. With respect to the obtained sample, X-ray diffraction measurement with a 2θ/θ concentrated optical system using Cu—Kα rays is performed under the following conditions: output: 50 kV, 250 mA, incident side solar slit: 5°, divergence vertical slit: 2/3°, divergence vertical restriction slit: 5 mm, scattering slit: 2/3°, light receiving side solar slit: 5°, light receiving slit: 0.3 mm, BENT monochromator, light receiving monochromatic slit: 0.8 mm, sampling width: 0.01°, scan speed: 4°/min, and 2θ measurement range: 20° to 155°. The apparatus can be an X-ray diffractometer (model "SmartLab") manufactured by Rigaku Corporation. From the X-ray diffraction patterns, the peak intensities of the respective crystal planes of the TiCN layer are determined. From the obtained peak intensities of the respective crystal planes, the texture coefficient TC(331) of the (331) plane in the Ti carbonitride layer is calculated from the formula (1).

The average thickness of the Ti carbonitride layer comprised in the lower layer is preferably 2.5 µm or more and 15.0 µm or less. When the average thickness of the Ti carbonitride layer comprised in the lower layer is 2.5 µm or more, the wear resistance and fracture resistance of the coated cutting tool tend to be improved. Furthermore, the texture coefficient TC(331) in the Ti carbonitride layer comprised in the lower layer tends to increase, and the above-described effect tends to further increase. Meanwhile, where the average thickness of the Ti carbonitride layer comprised in the lower layer is 15.0 µm or less, the adhesion is improved, and therefore the coated cutting tool tends to have excellent fracture resistance. From the same viewpoint, the average thickness of the Ti carbonitride layer comprised in the lower layer is more preferably 3.5 µm or more and 14.0 µm or less, and further preferably 4.5 µm or more and 13.5 µm or less.

The average grain size of the grains constituting the Ti carbonitride layer of the lower layer is preferably 0.3 µm or more and 2.0 µm or less. Where the average grain size of the grains constituting the Ti carbonitride layer of the lower layer is 0.3 µm or more, the toughness is improved, so that the fracture resistance of the coated cutting tool tends to be improved. Meanwhile, where the average grain size of the grains constituting the Ti carbonitride layer of the lower layer is 2.0 µm or less, the adhesion with the upper layer is improved, and thus peeling can be suppressed, so that the fracture resistance of the coated cutting tool tends to improve. From the same viewpoint, the average grain size of the grains constituting the Ti carbonitride layer of the lower layer is more preferably 0.4 µm or more and 1.9 µm or less, and more preferably 0.4 µm or more and 1.8 µm or less.

In the present embodiment, the average grain size of the grains constituting the Ti carbonitride layer of the lower layer can be determined by observing the cross-sectional structure of the Ti carbonitride layer of the lower layer by using a commercially available field emission scanning electron microscope (FE-SEM) or an electron backscatter diffraction imager (EBSD) attached to a transmission electron microscope (TEM). Specifically, the cross section of the Ti carbonitride layer in the coated cutting tool is mirror-polished, and the obtained mirror-polished surface is taken as a cross-sectional texture. The method for mirror-polishing the Ti carbonitride layer is not particularly limited, and examples thereof include a method of polishing using a diamond paste and/or colloidal silica, and ion milling. A sample having the cross-sectional texture of the coated cutting tool is set in the FE-SEM, and the cross-sectional texture of the sample is irradiated with an electron beam at an incident angle of 70 degrees at an accelerating voltage of 15 kV and an irradiation current of 0.5 nA. The cross-sectional texture of the Ti carbonitride layer of the lower layer of the coated cutting tool is preferably measured by EBSD at a step size of 0.1 µm in a measurement range of (average thickness of Ti carbonitride layer–0.5 µm)×50 µm. At this time, a boundary having an orientation difference of 5° or more is regarded as a grain boundary, and a region surrounded by this grain boundary is taken as a grain. Here, the grain size when obtaining the average grain size means the grain size in the direction orthogonal to the film thickness direction of the coating layer. At this time, the grain size of each grain is preferably determined at the position of 50% of the average thickness of the Ti carbonitride layer. Specifically, first, a straight line is drawn at a position of 50% of the average thickness of the Ti carbonitride layer in a direction orthogonal to the film thickness direction. Next, the number of grains included in the range of the straight line is determined. The value obtained by dividing the length of the straight line by the number of grains can be taken as the average grain size. At this time, image analysis software may be used when obtaining the grain size from the cross-sectional texture of the Ti carbonitride layer. The average grain size of each specified grain can be determined in such a manner.

The Ti compound layer of the lower layer is constituted of one or more layers described above, but may include a trace amount of a component other than the above elements as long as the effects of the present invention are exhibited.

Upper Layer

In the coated cutting tool of the present embodiment, the coating layer comprises a lower layer and an upper layer formed on the surface of the lower layer. The upper layer used in this embodiment comprises an α-aluminum oxide layer. The α-aluminum oxide layer is made of α-aluminum oxide. Since the coated cutting tool of the present embodiment comprises the upper layer made of the α-aluminum oxide layer, it is possible to suppress the reactive wear due to the oxidation of the Ti compound layer as the lower layer. As a result, the coated cutting tool of the present embodiment has improved wear resistance.

The average thickness of the upper layer used in the present embodiment is 3.0 μm or more and 15.0 μm or less. Where the average thickness of the upper layer is 3.0 μm or more, the crater wear resistance on the rake face of the coated cutting tool tends to be further improved, and where the average thickness of the upper layer is 15.0 μm or less, peeling of the coating layer tends to be further suppressed and the fracture resistance of the coated cutting tool tends to be further improved. From the same viewpoint, the average thickness of the upper layer is more preferably 3.0 μm or more and 14.0 μm or less, even more preferably 3.0 μm or more and 13.0 μm or less, and still more preferably 3.0 μm or more and 12.0 μm or less.

The upper layer is constituted of an α-aluminum oxide layer, but may include a trace amount of components other than α-aluminum oxide (α-$Al_2O_3$) as long as the effects of the present invention are exhibited.

Outer Layer

In the coated cutting tool according to the present embodiment, the coating layer preferably comprises an outer layer formed on the surface of the upper layer. The outer layer comprises a Ti nitride layer and/or a Ti carbonitride layer.

Further, the average thickness of the outer layer is preferably 0.1 μm or more and 5.0 μm or less. Where the average thickness of the outer layer is 0.1 μm or more, the effect of preventing the grains from falling out of the α-aluminum oxide layer is improved, and when the average thickness of the outer layer is 5.0 μm or less, the fracture resistance is improved. From the same viewpoint, the average thickness of the outer layer is more preferably 0.2 μm or more and 3.5 μm or less, and further preferably 0.3 μm or more and 3.0 μm or less.

The outer layer is a layer comprising Ti nitride and/or Ti carbonitride. However, as long as the effects of the present invention are exhibited, the outer layer may include a trace amount of components other than Ti nitride and/or Ti carbonitride.

For example, the following method can be used for forming each layer constituting the coating layer in the coated cutting tool of the present embodiment. However, this method of forming each layer is not limiting.

First, a lower layer, which is a specific Ti compound layer, is formed on the surface of the substrate.

A method for forming the Ti carbonitride layer (hereinafter also referred to as "TiCN layer") that has a composition represented by the formula (i) and the texture coefficient TC(331) of the (331) plane represented by the above formula (1) in the above specific range a part of the lower layer can be exemplified by a method in which the following step (1) and step (2) are sequentially implemented.

Step 1

A part of the TiCN layer is formed by a chemical vapor deposition method in which the raw material composition is $TiCl_4$: 3.5 mol % to 8.0 mol %, $CH_3CN$: 0.8 mol % to 2.0 mol %, $H_2$: balance, the temperature is 800° C. to 850° C., and the pressure is 70 hPa to 120 hPa. The time for step 1 is 3 min to 15 min.

Step 2

The entire TiCN layer is formed by a chemical vapor deposition method in which the raw material composition is $TiCl_4$: 3.5 mol % to 8.0 mol %, $CH_3CN$: 0.3 mol % to 1.0 mol %, $C_2H_4$ 1.0 mol % to 3.0 mol %, $H_2$: balance, the temperature is 900° C. to 950° C., and the pressure is 70 hPa to 120 hPa.

Where the time of step 1 is lengthened in the formation of the TiCN layer, the texture coefficient TC(331) can be increased. Further, when the temperature in step 1 is increased, the texture coefficient TC(331) can be increased. Further, where the amount of $C_2H_4$ as the raw material is increased in step 2, the atomic ratio of C element can be increased. Further, where the ratio ($TiCl_4$/$CH_3CN$) of the raw materials $TiCl_4$ and $CH_3CN$ is reduced in step 1, the average grain size of the grains constituting the TiCN layer can be increased. Further, where the temperature in step 2 is increased, the average grain size of the grains constituting the TiCN layer can be increased. Further, where the average thickness of the TiCN layer is increased, the average grain size of the grains constituting the TiCN layer tends to increase.

The other lower layers are formed, for example, by the following method.

For example, a Ti compound layer composed of a Ti nitride layer (hereinafter also referred to as "TiN layer") can be formed by a chemical vapor deposition method in which the raw material composition is $TiCl_4$: 5.0 mol % to 10.0 mol %, $N_2$: 20 mol % to 60 mol %, $H_2$: balance, the temperature is 850° C. to 950° C. and the pressure is 300 hPa to 400 hPa.

The Ti compound layer composed of a Ti carbide layer (hereinafter also referred to as "TiC layer") can be formed by a chemical vapor deposition method in which the raw material composition is $TiCl_4$: 1.5 mol % to 3.5 mol %, $CH_4$: 3.5 mol % to 5.5 mol %, $H_2$: balance, the temperature is 950° C. to 1,050° C. and the pressure is 70 hPa to 80 hPa.

The Ti compound layer composed of a Ti oxycarbonitride layer (hereinafter also referred to as "TiCNO layer") can be formed by a chemical vapor deposition method in which the raw material composition is $TiCl_4$: 3.0 mol % to 4.0 mol %, CO: 0.5 mol % to 1.0 mol %, $N_2$: 30 mol % to 40 mol %, $H_2$: balance, the temperature is 950° C. to 1,050° C. and the pressure is 50 hPa to 150 hPa.

The Ti compound layer composed of a Ti oxycarbide layer (hereinafter also referred to as "TiCO layer") can be formed by a chemical vapor deposition method in which the raw material composition is $TiCl_4$: 1.0 mol % to 2.0 mol %, CO: 2.0 mold % to 3.0 mol %, $H_2$: balance, the temperature is 950° C. to 1,050° C. and the pressure is 50 hPa to 150 hPa.

Next, an upper layer made of an α-aluminum oxide layer is formed on the surface of the lower layer. The upper layer is formed, for example, by the following method.

First, a lower layer composed of one or more Ti compound layers is formed on the surface of the substrate. Then, the surface of the layer farthest from the substrate is oxidized (hereinafter, this step is also referred to as "oxidation treatment step"). After that, an α-aluminum oxide layer is formed on the surface of the layer subjected to the oxidation treatment (hereinafter, this step is also referred to as a "film forming step").

In the oxidation treatment step, the surface of the layer farthest from the substrate is oxidized under the conditions of the raw material composition of CO: 0.1 mol % to 0.5 mol %, $CO_2$: 0.1 mol % to 1.0 mol %, and $H_2$: balance, the temperature of 950° C. to 1,050° C. and the pressure of 45 hPa to 65 hPa. The oxidation treatment time in this case is preferably 1 min to 5 min.

Then, in the film forming step, the α-aluminum oxide layer is formed by a chemical vapor deposition method in which the raw material composition is $AlCl_3$: 2.0 mol % to 4.0 mol %, $CO_2$: 1.0 mol % to 5.0 mol %, HCl: 1.5 mol % to 3.0 mol %, $H_2S$: 0.05 mol % to 0.2 mol %, $H_2$: balance, the temperature is 950° C. to 1,050° C. and the pressure is 60 hPa to 80 hPa.

An outer layer composed of a TiN layer and/or a TiCN layer is formed on the surface of an upper layer made of an α-aluminum oxide layer. The outer layer is formed, for example, by the following method.

The TiN layer is formed by a chemical vapor deposition method in which the raw material composition is $TiCl_4$: 5.0 mol % to 10.0 mol %, $N_2$: 20 mol % to 60 mol %, $H_2$: balance, the temperature is 950° C. to 1,050° C. and the pressure is 300 hPa to 400 hPa.

The TiCN layer is formed by a chemical vapor deposition method in which the raw material composition is $TiCl_4$: 4.0 mol % to 8.0 mol %, $CH_3CN$: 0.5 mol % to 2.0 mol %, $N_2$: 3.0 mol % to 7.0 mol %, $H_2$: balance, the temperature is 950° C. to 1,050° C. and the pressure is 60 hPa to 80 hPa.

The thickness of each layer in the coating layers of the coated cutting tool of the present embodiment can be measured by observing the sectional structure of the coated cutting tool using an optical microscope, a scanning electron microscope (SEM), an FE-SEM, or the like. In addition, the average thickness of each layer in the coated cutting tool of the present embodiment can be obtained by measuring the thickness of each layer at three or more locations in the vicinity of a position of 50 μm from the edge ridge portion toward the center of the rake face of the coated cutting tool and finding the arithmetic mean value thereof. Further, the composition of each layer can be measured from the sectional structure of the coated cutting tool of the present embodiment by using an energy dispersive X-ray spectrometer (EDS), a wavelength dispersive X-ray spectrometer (WDS), or the like.

EXAMPLES

Hereinafter, the present invention will be described in more detail with reference to examples, but the present invention is not limited to these examples.

As a substrate, a cutting insert made of cemented carbide having an insert shape: CNMG120408 (ISO) and a composition of 93.4WC-6.2Co-0.4$Cr_3C_2$ (above mass %) was prepared. After round honing was performed on the edge ridge portion of the substrate with a SiC brush, the surface of the substrate was washed.

After washing the surface of the substrate, a coating layer was formed by a chemical vapor deposition method. First, the substrate was placed into an external heating type chemical vapor deposition apparatus, and under the conditions of the raw material composition, temperature and pressure shown in Table 1, the first layer (TiN layer or TiC layer) having the composition shown in Table 5 was formed on the surface of the substrate to obtain the average thickness shown in Table 5. Next, under the conditions of the raw material composition, temperature and pressure shown in Table 2, a part of the second layer (TiCN layer) was formed on the surface of the first layer for the time shown in Table 2, and then the remaining part of the second layer (TiCN layer) having the composition shown in Table 5 was formed under the conditions of the raw material composition, temperature and pressure shown in Table 3 on the surface of the first layer so as to obtain the average thickness shown in Table 5. Next, the third layer (TiCNO layer or TiCO layer) having the composition shown in Table 5 was formed on the surface of the second layer under the conditions of the raw material composition, temperature and pressure shown in Table 1 to obtain the average thickness shown in Table 5. As a result, a lower layer composed of three layers was formed. Next, oxidation treatment was performed under the conditions of the raw material composition, temperature and pressure shown in Table 4. The oxidation treatment time was 2 min. Next, the upper layer (α-aluminum oxide layer) having the composition shown in Table 5 was formed under the conditions of the raw material composition, temperature and pressure shown in Table 1 on the surface of the third layer subjected to the oxidation treatment to obtain the average thickness shown in Table 5. Finally, the outer layer (TiN layer or TiCN layer) having the composition shown in Table 5 was formed under the conditions of the raw material composition, temperature and pressure shown in Table 1 on the surface of the upper layer (α type aluminum oxide layer) to obtain the average thickness shown in Table 5. Thus, the coated cutting tools of Invention Samples 1 to 14 and Comparative Samples 1 to 7 were obtained.

The thickness of each layer of the sample was determined in the following manner. That is, using FE-SEM, the thickness at three points in the cross section in the vicinity of the position of 50 μm from the edge ridge portion of the coated cutting tool toward the center of the rake face was measured, and the arithmetic mean value was determined as the average thickness. The composition of each layer of the obtained sample was measured using EDS in the cross section near the position of 50 μm from the edge ridge portion of the coated cutting tool toward the center of the rake face.

TABLE 1

| | Composition of each layer | Temperature (° C.) | Pressure (hPa) | Raw material composition (mol %) |
|---|---|---|---|---|
| Lower layer | TiN (first layer) | 900 | 350 | $TiCl_4$: 7.5%, $N_2$: 40.0%, $H_2$: 52.5% |
| | TiC (first layer) | 1,000 | 75 | $TiCl_4$: 2.4%, $CH_4$: 4.6%, $H_2$: 93.0% |
| | TiCNO (third layer) | 1,000 | 100 | $TiCl_4$: 3.5%, CO: 0.7%, $N_2$: 35.5%, $H_2$: 60.3% |
| | TiCO (third layer) | 1,000 | 80 | $TiCl_4$: 1.5%, CO: 2.5%, $H_2$: 96.0% |
| Upper layer | α-$Al_2O_3$ | 1,000 | 70 | $AlCl_3$: 2.5%, $CO_2$: 3.0%, HCl: 2.3%, $H_2S$: 0.1%, $H_2$: 92.1% |

TABLE 1-continued

| Composition of each layer | | Temperature (° C.) | Pressure (hPa) | Raw material composition (mol %) |
|---|---|---|---|---|
| Outer layer | TiN | 1,000 | 350 | $TiCl_4$: 7.5%, $N_2$: 40.0%, $H_2$: 52.5% |
| | TiCN | 1,000 | 70 | $TiCl_4$: 6.0%, CH3CN: 1.0%, $N_2$: 5.0%, $H_2$: 88.0% |

TABLE 2

TiCN-1 (second layer of lower layer-1)

| Sample Number | Temperature (° C.) | Pressure (hPa) | Raw material composition (mol %) | | | Time (min) |
|---|---|---|---|---|---|---|
| | | | $TiCl_4$ | $CH_3CN$ | $H_2$ | |
| Invention Sample 1 | 820 | 90 | 4.0 | 1.0 | 95.0 | 15.0 |
| Invention Sample 2 | 820 | 90 | 4.0 | 1.0 | 95.0 | 15.0 |
| Invention Sample 3 | 820 | 90 | 4.0 | 1.0 | 95.0 | 5.0 |
| Invention Sample 4 | 820 | 90 | 4.0 | 1.0 | 95.0 | 30.0 |
| Invention Sample 5 | 800 | 90 | 4.0 | 1.0 | 95.0 | 15.0 |
| Invention Sample 6 | 850 | 90 | 4.0 | 1.0 | 95.0 | 15.0 |
| Invention Sample 7 | 820 | 90 | 4.0 | 1.5 | 94.5 | 15.0 |
| Invention Sample 8 | 820 | 90 | 4.0 | 1.0 | 95.0 | 15.0 |
| Invention Sample 9 | 820 | 90 | 4.0 | 1.0 | 95.0 | 15.0 |
| Invention Sample 10 | 820 | 70 | 4.0 | 1.0 | 95.0 | 15.0 |
| Invention Sample 11 | 820 | 120 | 4.0 | 1.0 | 95.0 | 15.0 |
| Invention Sample 12 | 820 | 90 | 6.0 | 1.0 | 93.0 | 15.0 |
| Invention Sample 13 | 820 | 90 | 8.0 | 1.0 | 91.0 | 15.0 |
| Invention Sample 14 | 820 | 90 | 4.0 | 1.0 | 95.0 | 15.0 |
| Comparative Sample 1 | No process | | | | | |
| Comparative Sample 2 | No process | | | | | |
| Comparative Sample 3 | 800 | 90 | 4.0 | 1.0 | 95.0 | 5.0 |
| Comparative Sample 4 | 850 | 90 | 4.0 | 1.0 | 95.0 | 15.0 |
| Comparative Sample 5 | 820 | 90 | 4.0 | 1.0 | 95.0 | 10.0 |
| Comparative Sample 6 | 820 | 90 | 4.0 | 1.0 | 95.0 | 15.0 |
| Comparative Sample 7 | 820 | 70 | 4.0 | 1.0 | 95.0 | 5.0 |

TABLE 3

TiCN-2 (second layer of lower layer-2)

| Sample Number | Temperature (° C.) | Pressure (hPa) | Raw material composition (mol %) | | | |
|---|---|---|---|---|---|---|
| | | | $TiCl_4$ | $CH_3CN$ | $C_2H_4$ | $H_2$ |
| Invention Sample 1 | 930 | 90 | 4.0 | 0.5 | 1.8 | 93.7 |
| Invention Sample 2 | 930 | 90 | 4.0 | 0.5 | 1.8 | 93.7 |
| Invention Sample 3 | 900 | 90 | 4.0 | 0.5 | 1.8 | 93.7 |
| Invention Sample 4 | 930 | 90 | 4.0 | 0.5 | 1.8 | 93.7 |
| Invention Sample 5 | 930 | 90 | 4.0 | 0.5 | 1.8 | 93.7 |
| Invention Sample 6 | 930 | 90 | 4.0 | 0.7 | 1.8 | 93.5 |
| Invention Sample 7 | 950 | 90 | 4.0 | 0.5 | 1.8 | 93.7 |
| Invention Sample 8 | 950 | 90 | 5.0 | 0.5 | 1.8 | 92.7 |
| Invention Sample 9 | 930 | 90 | 4.0 | 0.5 | 1.8 | 93.7 |
| Invention Sample 10 | 930 | 90 | 4.0 | 0.5 | 1.0 | 94.5 |
| Invention Sample 11 | 930 | 90 | 4.0 | 0.8 | 2.8 | 92.4 |
| Invention Sample 12 | 930 | 90 | 3.7 | 0.5 | 1.8 | 94.0 |
| Invention Sample 13 | 930 | 70 | 4.0 | 0.5 | 1.8 | 93.7 |
| Invention Sample 14 | 930 | 90 | 4.0 | 0.5 | 1.5 | 94.0 |
| Comparative Sample 1 | 920 | 90 | 6.0 | 1.0 | 1.8 | 91.2 |
| Comparative Sample 2 | 880 | 90 | 4.0 | 0.5 | 1.8 | 93.7 |
| Comparative Sample 3 | 930 | 90 | 4.0 | 0.5 | 1.8 | 93.7 |
| Comparative Sample 4 | 930 | 90 | 6.0 | 1.0 | 1.8 | 91.2 |
| Comparative Sample 5 | 930 | 90 | 4.0 | 0.5 | 1.8 | 93.7 |
| Comparative Sample 6 | 950 | 90 | 4.0 | 0.5 | 1.8 | 93.7 |
| Comparative Sample 7 | 930 | 90 | 8.0 | 1.0 | 0.0 | 91.0 |

TABLE 4

| | Temperature (° C.) | Pressure (hPa) | Raw material composition (mol %) | Time (min) |
|---|---|---|---|---|
| Oxidation treatment | 1,000 | 55 | CO: 0.3%, $CO_2$: 0.5%, $H_2$: 99.2% | 2 |

TABLE 5

| | | Coating layer | | | | | | | | | |
|---|---|---|---|---|---|---|---|---|---|---|---|
| | | Lower layer | | | | | | Upper layer | | Outer layer | Total |
| | First layer | Second layer (TiC$_x$N$_{1-x}$) | | Third layer | | Total | | | | | |
| Sample Number | Composition | Average thickness (μm) | Atomic ratio of C element, x | Average thickness (μm) | Composition | Average thickness (μm) | thickness of lower layer (μm) | Composition | Crystal system | Average thickness (μm) | Composition | Average thickness (μm) | thickness of coating layer (μm) |
| Invention Sample 1 | — | 0.0 | 0.80 | 10.0 | TiCNO | 0.3 | 10.3 | Al$_2$O$_3$ | α | 5.0 | — | 0.0 | 15.3 |
| Invention Sample 2 | TiN | 0.2 | 0.80 | 10.0 | TiCNO | 0.3 | 10.5 | Al$_2$O$_3$ | α | 5.0 | TiN | 0.3 | 15.8 |
| Invention Sample 3 | TiN | 0.2 | 0.80 | 10.0 | TiCNO | 0.3 | 10.5 | Al$_2$O$_3$ | α | 5.0 | TiN | 0.3 | 15.8 |
| Invention Sample 4 | TiN | 0.2 | 0.80 | 10.0 | TiCNO | 0.3 | 10.5 | Al$_2$O$_3$ | α | 5.0 | TiN | 0.3 | 15.8 |
| Invention Sample 5 | TiN | 0.2 | 0.80 | 4.5 | TiCNO | 0.3 | 5.0 | Al$_2$O$_3$ | α | 5.0 | TiN | 0.3 | 10.3 |
| Invention Sample 6 | TiN | 0.2 | 0.80 | 13.5 | TiCNO | 0.3 | 14.0 | Al$_2$O$_3$ | α | 5.0 | TiN | 0.3 | 19.3 |
| Invention Sample 7 | TiN | 0.2 | 0.80 | 10.0 | TiCNO | 0.3 | 10.5 | Al$_2$O$_3$ | α | 5.0 | TiN | 0.3 | 15.8 |
| Invention Sample 8 | TiC | 0.2 | 0.80 | 12.0 | TiCNO | 0.3 | 12.5 | Al$_2$O$_3$ | α | 3.0 | TiN | 0.3 | 15.8 |
| Invention Sample 9 | TiN | 0.2 | 0.80 | 10.0 | TiCO | 0.3 | 10.5 | Al$_2$O$_3$ | α | 12.0 | TiN | 0.3 | 22.8 |
| Invention Sample 10 | TiN | 0.2 | 0.67 | 10.0 | TiCNO | 0.3 | 10.5 | Al$_2$O$_3$ | α | 5.0 | TiN | 0.3 | 15.8 |
| Invention Sample 11 | TiN | 0.2 | 0.89 | 10.0 | TiCNO | 0.3 | 10.5 | Al$_2$O$_3$ | α | 5.0 | TiN | 0.3 | 15.8 |
| Invention Sample 12 | TiN | 0.2 | 0.80 | 12.0 | TiCNO | 0.3 | 12.5 | Al$_2$O$_3$ | α | 12.0 | TiN | 0.8 | 25.3 |
| Invention Sample 13 | TiN | 0.2 | 0.80 | 10.0 | TiCNO | 0.3 | 10.5 | Al$_2$O$_3$ | α | 5.0 | TiCN | 3.0 | 18.5 |
| Invention Sample 14 | TiN | 0.2 | 0.72 | 10.0 | TiCNO | 0.3 | 10.5 | Al$_2$O$_3$ | α | 5.0 | TiN | 0.3 | 15.8 |
| Comparative Sample 1 | TiN | 0.2 | 0.80 | 10.0 | TiCNO | 0.3 | 10.5 | Al$_2$O$_3$ | α | 5.0 | TiN | 0.3 | 15.8 |
| Comparative Sample 2 | TiN | 0.2 | 0.80 | 10.0 | TiCNO | 0.3 | 10.5 | Al$_2$O$_3$ | α | 5.0 | TiN | 0.3 | 15.8 |
| Comparative Sample 3 | TiN | 0.2 | 0.80 | 1.5 | TiCNO | 0.3 | 2.0 | Al$_2$O$_3$ | α | 12.0 | TiN | 0.3 | 14.3 |
| Comparative Sample 4 | TiN | 0.2 | 0.80 | 17.0 | TiCNO | 0.3 | 17.5 | Al$_2$O$_3$ | α | 5.0 | TiN | 0.3 | 22.8 |
| Comparative Sample 5 | TiN | 0.2 | 0.80 | 4.5 | TiCNO | 0.3 | 5.0 | Al$_2$O$_3$ | α | 19.0 | TiN | 0.3 | 24.3 |
| Comparative Sample 6 | TiN | 0.2 | 0.80 | 10.0 | TiCNO | 0.3 | 10.5 | Al$_2$O$_3$ | α | 1.0 | TiN | 0.3 | 11.8 |
| Comparative Sample 7 | TiN | 0.2 | 0.60 | 10.0 | TiCNO | 0.3 | 10.5 | Al$_2$O$_3$ | α | 5.0 | TiN | 0.3 | 15.8 |

* "—" indicates that the layer was not formed.

Texture Coefficient

With respect to the obtained Invention Samples 1 to 14 and Comparative Samples 1 to 7, X-ray diffraction measurement with a 2θ/θ concentrated optical system using Cu—Kα rays was performed under the following conditions: output: 50 kV, 250 mA, incident side solar slit: 5°, divergence vertical slit: 2/3°, divergence vertical restriction slit: 5 mm, scattering slit: 2/3°, light receiving side solar slit: 5°, light receiving slit: 0.3 mm, BENT monochromator, light receiving monochromatic slit: 0.8 mm, sampling width: 0.01°, scan speed: 4°/min, 2θ measurement range: 20° to 155°. The apparatus used was an X-ray diffractometer (model "SmartLab") manufactured by Rigaku Corporation. From the X-ray diffraction patterns, the peak intensities of the respective crystal planes of the TiCN layer of the lower layer in the obtained Invention Samples 1 to 14 and Comparative Samples 1 to 7 were determined. From the obtained peak intensities of the respective crystal planes, the texture coefficient TC(331) of the (331) plane, the texture coefficient TC(220) of the (220) plane and the texture coefficient TC(422) of the (422) plane in the TiCN layer of the lower layer were sequentially calculated from the following formulas (1) to (3). The results are shown in Table 6.

$$TC(331) = \frac{I(331)}{I_0(331)} \left\{ \frac{1}{8} \sum \frac{I(hkl)}{I_0(hkl)} \right\}^{-1} \quad (1)$$

$$TC(220) = \frac{I(220)}{I_0(220)} \left\{ \frac{1}{8} \sum \frac{I(hkl)}{I_0(hkl)} \right\}^{-1} \quad (2)$$

$$TC(422) = \frac{I(422)}{I_0(422)} \left\{ \frac{1}{8} \sum \frac{I(hkl)}{I_0(hkl)} \right\}^{-1} \quad (3)$$

In the formulas (1) to (3), I(hkl) represents a peak intensity of the (hkl) plane in X-ray diffraction of the TiCN layer, $I_0$(hkl) represents an average value of a standard diffraction intensity of the (hkl) plane of Ti carbide in a JCPDS card number 32-1383 and a standard diffraction intensity of the (hkl) plane of Ti nitride in a JCPDS card number 32-1420, and (hkl) indicates eight crystal planes (111), (200), (220), (311), (331), (420), (422), and (511).

Average Grain Size

With respect to the obtained Invention Samples 1 to 14 and Comparative Samples 1 to 7, the average grain size of the grains constituting the TiCN layer of the lower layer was measured using the EBSD attached to the FE-SEM. Specifically, after polishing the coated cutting tool with a diamond paste, final polishing was performed with colloidal silica to obtain a cross-sectional texture of the coated cutting tool. A sample having the cross-sectional texture of the coated cutting tool was set in the FE-SEM, and the cross-sectional texture of the sample was irradiated with an electron beam at an incident angle of 70 degrees at an accelerating voltage of 15 kV and an irradiation current of 0.5 nA. The cross-sectional texture of the TiCN layer of the lower layer of the coated cutting tool was measured by EBSD at a step size of 0.1 μm in a measurement range of (average thickness of TiCN layer–0.5 μm)×50 μm. At this time, a boundary having an orientation difference of 5° or more was regarded as a grain boundary, and a region surrounded by this grain boundary was defined as a grain. Here, the grain size when obtaining the average grain size was the grain size in the direction orthogonal to the film thickness direction of the coating layer. At this time, the grain size of each grain was determined at the position of 50% of the average thickness of the TiCN layer. Specifically, first, a straight line was drawn at a position of 50% of the average thickness of the TiCN layer in a direction orthogonal to the film thickness direction. Next, the number of grains included in the range of the straight line was obtained. The value obtained by dividing the length of the straight line by the number of grains was taken as the average grain size. At this time, the grain size was obtained from the cross-sectional texture of the TiCN layer using image analysis software. With respect to the TiCN layer, the average grain size of each specified grain was obtained. The results are shown in Table 6.

TABLE 6

| | TiCN layer of lower layer | | | |
|---|---|---|---|---|
| Sample number | TC (220) | TC (331) | TC (422) | Average grain size (μm) |
| Invention Sample 1 | 1.2 | 2.4 | 1.1 | 0.8 |
| Invention Sample 2 | 1.3 | 2.6 | 1.2 | 0.8 |
| Invention Sample 3 | 1.2 | 1.7 | 1.4 | 0.4 |
| Invention Sample 4 | 0.8 | 3.8 | 1.0 | 1.0 |
| Invention Sample 5 | 1.1 | 2.2 | 1.2 | 0.9 |
| Invention Sample 6 | 1.2 | 2.7 | 1.3 | 1.2 |
| Invention Sample 7 | 1.1 | 2.6 | 1.0 | 1.8 |
| Invention Sample 8 | 1.3 | 2.8 | 1.2 | 1.4 |
| Invention Sample 9 | 1.1 | 2.5 | 1.4 | 0.9 |
| Invention Sample 10 | 1.2 | 2.8 | 1.1 | 0.7 |
| Invention Sample 11 | 1.0 | 2.7 | 1.2 | 0.8 |
| Invention Sample 12 | 1.2 | 2.8 | 1.2 | 1.0 |
| Invention Sample 13 | 1.1 | 2.6 | 1.2 | 0.7 |
| Invention Sample 14 | 1.2 | 2.6 | 1.0 | 0.8 |
| Comparative Sample 1 | 2.8 | 0.5 | 0.8 | 0.3 |
| Comparative Sample 2 | 1.1 | 0.4 | 3.1 | 0.3 |
| Comparative Sample 3 | 1.2 | 1.5 | 1.3 | 0.4 |
| Comparative Sample 4 | 1.1 | 2.8 | 0.9 | 2.0 |
| Comparative Sample 5 | 1.0 | 2.2 | 1.2 | 0.9 |
| Comparative Sample 6 | 1.2 | 2.5 | 1.1 | 0.7 |
| Comparative Sample 7 | 1.3 | 1.8 | 1.5 | 0.4 |

Using the obtained Invention Samples 1 to 14 and Comparative Samples 1 to 7, cutting tests were conducted under the following conditions.

Cutting Test 1: Wear Resistance Test
Work material: disk-shaped FCD600,
Cutting speed: 150 m/min,
Feed: 0.30 mm/rev,
Depth of cut: 2.0 mm,
Coolant: Used,
Evaluation items: A time when a sample was fractured or had a maximum flank wear width of 0.3 mm was defined as the end of the tool life, and the machining time to reach the end of the tool life was measured.

Regarding the machining time to reach the end of the tool life in cutting test 1 (wear resistance test), 30 min or more was evaluated as "A", 25 min or more and less than 30 min was evaluated as "B", and less than 25 min was evaluated as "C". In this evaluation, "A" is the best, "B" is the second best, and "C" is the worst, and "A" or "B" means excellent cutting performance. Table 7 shows the obtained evaluation results.

TABLE 7

| | Wear resistance test Cutting test (1) | |
|---|---|---|
| Sample number | Machining time until tool life (min) | Evaluation |
| Invention Sample 1 | 27 | B |
| Invention Sample 2 | 30 | A |
| Invention Sample 3 | 25 | B |
| Invention Sample 4 | 32 | A |
| Invention Sample 5 | 23 | B |
| Invention Sample 6 | 33 | A |
| Invention Sample 7 | 28 | B |
| Invention Sample 8 | 26 | B |
| Invention Sample 9 | 34 | A |
| Invention Sample 10 | 25 | B |
| Invention Sample 11 | 34 | A |
| Invention Sample 12 | 32 | A |
| Invention Sample 13 | 34 | A |
| Invention Sample 14 | 26 | B |
| Comparative Sample 1 | 17 | C |
| Comparative Sample 2 | 15 | C |
| Comparative Sample 3 | 12 | C |
| Comparative Sample 4 | 8 | C |
| Comparative Sample 5 | 5 | C |
| Comparative Sample 6 | 16 | C |
| Comparative Sample 7 | 20 | C |

Cutting Test 2: Fracture Resistance Test
Work material: round bar of FCD600 with two grooves,
Cutting speed: 150 m/min,
Feed: 0.30 mm/rev,
Depth of cut: 2.0 mm,
Coolant: used, Evaluation item: A time when a sample was fractured or had a maximum flank wear width of 0.3 mm was defined as the end of the tool life, and the machining time to reach the end of the tool life was measured.

Regarding the machining time to reach the end of the tool life in cutting test 2 (fracture resistance test), 13 min or more was evaluated as "A", 10 min or more and less than 13 min was evaluated as "B", and less than 10 min was evaluated as "C". In this evaluation, "A" is the best, "B" is the second best, and "C" is the worst, and "A" or "B" means excellent cutting performance. Table 8 shows the obtained evaluation results.

TABLE 8

| Sample number | Fracture resistance test Cutting test (2) | |
|---|---|---|
| | Machining time until tool life (min) | Evaluation |
| Invention Sample 1 | 11 | B |
| Invention Sample 2 | 14 | A |
| Invention Sample 3 | 12 | B |
| Invention Sample 4 | 15 | A |
| Invention Sample 5 | 13 | A |
| Invention Sample 6 | 12 | B |
| Invention Sample 7 | 13 | A |
| Invention Sample 8 | 14 | A |
| Invention Sample 9 | 11 | B |
| Invention Sample 10 | 14 | A |
| Invention Sample 11 | 12 | B |
| Invention Sample 12 | 10 | B |
| Invention Sample 13 | 12 | B |
| Invention Sample 14 | 13 | A |
| Comparative Sample 1 | 6 | C |
| Comparative Sample 2 | 13 | A |
| Comparative Sample 3 | 5 | C |
| Comparative Sample 4 | 6 | C |
| Comparative Sample 5 | 5 | C |
| Comparative Sample 6 | 8 | C |
| Comparative Sample 7 | 11 | B |

From the results shown in Tables 7 and 8, the evaluations of the wear resistance test and the fracture resistance test of the Invention Samples were both "B" or higher. Meanwhile, the evaluation of the Comparative Samples in the wear resistance test and/or the fracture resistance test was "C". Therefore, it can be seen that the wear resistance and fracture resistance of the Invention Samples are generally superior to those of the Comparative Samples. From the above results, it was found that the Invention Samples have a long tool life as a result of being excellent in wear resistance and fracture resistance.

INDUSTRIAL APPLICABILITY

Since the coated cutting tool of the present invention has excellent wear resistance and chipping resistance, the tool life can be extended as compared with the conventional coated cutting tool, and from such a viewpoint, the coated cutting tool of the present invention has industrial applicability.

REFERENCE SIGNS LIST

1: Substrate, 2: Lower layer, 3: Upper layer, 4: Outer layer, 5: Coating layer, 6: Coated cutting tool.

What is claimed is:

1. A coated cutting tool comprising a substrate and a coating layer formed on a surface of the substrate, wherein the coating layer comprises a lower layer and an upper layer formed on a surface of the lower layer, the lower layer comprises a Ti compound layer comprising one or more layers selected from the group consisting of a Ti carbide layer, a Ti nitride layer, a Ti carbonitride layer, a Ti oxycarbide layer, and a Ti oxycarbonitride layer, an average thickness of the lower layer is 3.0 μm or more and 15.0 μm or less, the upper layer comprises an α-aluminum oxide layer, an average thickness of the upper layer is 3.0 μm or more and 15.0 μm or less, the Ti compound layer comprises at least one Ti carbonitride layer, the composition of the Ti carbonitride layer is represented by the following formula (i):

$$Ti(C_xN_{1-x}) \quad (i),$$

wherein in the formula, x represents an atomic ratio of a C element to a total of the C element and an N element in the Ti carbonitride layer, and satisfies $0.65 < x \leq 0.90$, and in the Ti carbonitride layer, a texture coefficient TC(331) of a (331) plane represented by a following formula (1) is 1.5 or more and 4.0 or less:

wherein in the formula (1), I(hkl) represents a peak intensity of an (hkl) plane in X-ray diffraction of the Ti carbonitride layer, $I_0$(hkl) represents an average value of a standard diffraction intensity of the (hkl) plane of Ti carbide in a JCPDS card number 32-1383 and a standard diffraction intensity of the (hkl) plane of Ti nitride in a JCPDS card number 32-1420, and (hkl) indicates eight crystal planes (111), (200), (220), (311), (331), (420), (422), and (511) and wherein grains constituting the Ti carbonitride layer have an average grain size of 0.3 μm or more and 2.0 μm or less.

2. The coated cutting tool according to claim 1, wherein the texture coefficient TC(331) in the Ti carbonitride layer is 2.0 or more and 4.0 or less.

3. The coated cutting tool according to claim 1, wherein the coating layer comprises an outer layer formed on a surface of the upper layer, the outer layer comprises a Ti nitride layer and/or a Ti carbonitride layer, an average thickness of the outer layer is 0.1 μm or more and 5.0 μm or less.

4. The coated cutting tool according to claim 1, wherein an average thickness of the entire coating layer is 7.5 μm or more and 25.0 μm or less.

5. The coated cutting tool according to claim 1, wherein the substrate is composed of any of a cemented carbide, a cermet, a ceramic and a cubic boron nitride sintered body.

6. The coated cutting tool according to claim 2, wherein the coating layer comprises an outer layer formed on a surface of the upper layer, the outer layer comprises a Ti nitride layer and/or a Ti carbonitride layer, an average thickness of the outer layer is 0.1 μm or more and 5.0 μm or less.

7. The coated cutting tool according to claim 2, wherein an average thickness of the entire coating layer is 7.5 μm or more and 25.0 μm or less.

8. The coated cutting tool according to claim 3, wherein an average thickness of the entire coating layer is 7.5 μm or more and 25.0 μm or less.

9. The coated cutting tool according to claim 6, wherein an average thickness of the entire coating layer is 7.5 μm or more and 25.0 μm or less.

10. The coated cutting tool according to claim 2, wherein the substrate is composed of any of a cemented carbide, a cermet, a ceramic and a cubic boron nitride sintered body.

11. The coated cutting tool according to claim 3, wherein the substrate is composed of any of a cemented carbide, a cermet, a ceramic and a cubic boron nitride sintered body.

* * * * *